United States Patent
An et al.

(10) Patent No.: US 6,414,355 B1
(45) Date of Patent: Jul. 2, 2002

(54) SILICON-ON-INSULATOR (SOI) CHIP HAVING AN ACTIVE LAYER OF NON-UNIFORM THICKNESS

(75) Inventors: Judy Xilin An, San Jose; Bin Yu, Cupertino; William G. En, Milpitas, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/770,708

(22) Filed: Jan. 26, 2001

(51) Int. Cl.[7] .............................................. H01L 27/01
(52) U.S. Cl. ...................................... 257/347; 257/324
(58) Field of Search ............................. 257/324, 173, 257/174, 347–360, 329, 286, 487, 546; 438/216, 261, 591, 593

(56) References Cited

U.S. PATENT DOCUMENTS 5,973,358 A * 10/1999 Kishi ........................ 257/324
5,973,364 A * 10/1999 Kawanaka .................. 257/347
6,314,021 B1 * 11/2001 Maeda et al. ............... 257/314

* cited by examiner

Primary Examiner—Hoai V. Ho
Assistant Examiner—Long K. Tran
(74) Attorney, Agent, or Firm—Renner, Otto, Boisselle & Sklar, LLP

(57) ABSTRACT

A silicon-on-insulator (SOI) chip. The SOI chip has a substrate; a buried oxide (BOX) layer disposed on the substrate; and an active layer disposed on the BOX layer, the active layer divided into a first and a second tile, the first tile having a first thickness and the second tile having a second thickness, the second thickness being smaller than the first thickness. Also disclosed is a method of fabricating a silicon-on-insulator (SOI) chip having an active layer with a non-uniform thickness. The method includes the steps of providing a substrate; providing a buried oxide layer (BOX) on the substrate; providing an active layer on the BOX layer, the active layer having an initially uniform thickness; dividing the active layer into at least a first and a second tile; and altering the thickness of the active layer in the area of the second tile.

12 Claims, 6 Drawing Sheets

SILICON-ON-INSULATOR (SOI) CHIP HAVING AN ACTIVE LAYER OF NON-UNIFORM THICKNESS

TECHNICAL FIELD

The present invention generally relates to silicon-on-insulator (SOI) integrated circuits having analog devices and digital devices on one substrate and, more particularly, to an SOI chip having an active layer of non-uniform thickness to allow the fabrication of partially depleted transistors for digital circuitry and fully depleted transistors for analog circuitry.

BACKGROUND ART

Traditional silicon-on-insulator (SOI) integrated circuits typically have a silicon substrate having a buried oxide (BOX) layer disposed thereon. An active layer (also referred to as a silicon layer) is disposed on the BOX layer. Within the active layer, active devices, such as a transistors, are formed in active regions. The size and placement of the active regions are defined by shallow trench isolation (STI) regions. Therefore, the active devices are isolated from the substrate by the BOX layer. As is well known in the art, the foregoing traditional SOI structure provides significant advantages when constructing transistors for digital circuitry. More specifically, transistors constructed in SOI format have floating body effects which lead to the devices being partially depleted during operation.

However, in some instances, it may be desirable to fabricate analog circuitry on a chip also having SOI-based digital circuitry. Generally, analog circuitry performs better when made from fully depleted devices having less floating body effects than the devices used for the digital circuitry.

Accordingly, there exists a need in the art for hybrid, or mixed digital signal and analog signal, SOI chips with regions respectively suited for digital circuitry and analog circuitry.

SUMMARY OF THE INVENTION

According to one aspect of the invention, the invention is a silicon-on-insulator (SOI) chip. The SOI chip has a substrate; a buried oxide (BOX) layer disposed on the substrate; and an active layer disposed on the BOX layer, the active layer divided into a first and a second tile, the first tile having a first thickness and the second tile having a second thickness, the second thickness being smaller than the first thickness.

According to another aspect of the invention, the invention is a method of fabricating a silicon-on-insulator (SOI) chip having an active layer with a non-uniform thickness. The method includes the steps of providing a substrate; providing a buried oxide layer (BOX) on the substrate; providing an active layer on the BOX layer, the active layer having an initially uniform thickness; dividing the active layer into at least a first and a second tile; and altering the thickness of the active layer in the area of the second tile.

BRIEF DESCRIPTION OF DRAWINGS

These and further features of the present invention will be apparent with reference to the following description and drawings, wherein.

DISCLOSURE OF INVENTION

Figure 1A:
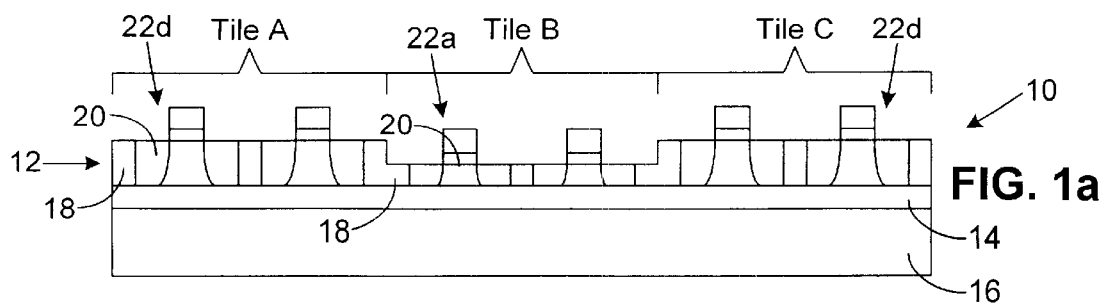
FIGS. 1a–1c are cross-sections of exemplary SOI chips having an active layer of non-uniform thickness according to various embodiments of the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1B:
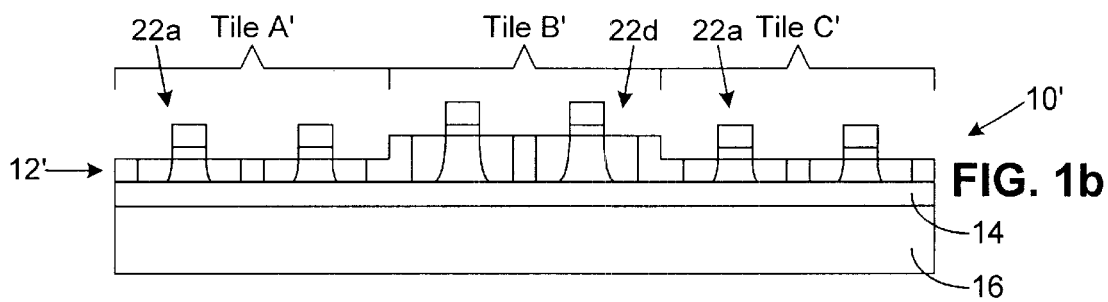
Figure 1C:
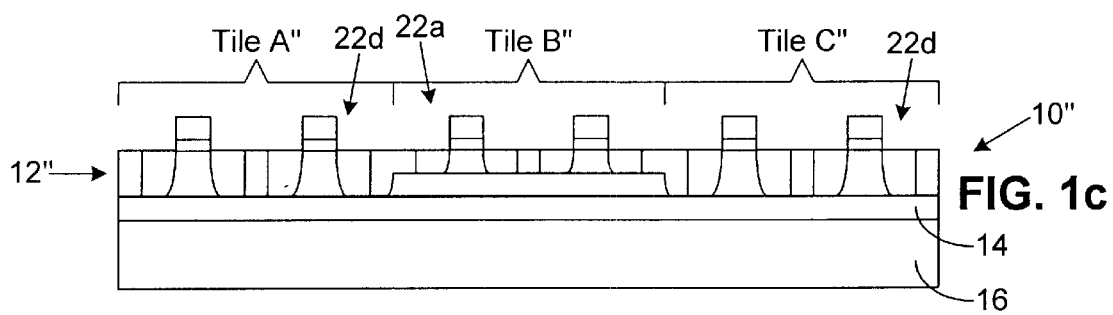

With general reference to FIGS. 1a–1c, cross sections of exemplary silicon-on-insulator (SOI) chips are illustrated where each exemplary chip has an active layer of non-uniform thickness. More specifically, each chip is divided into tiles. The thickness of the active layer is substantially uniform over the area of each individual tile, but each tile may have a different thickness compared to other tiles on the chip. Selected tiles having a relatively thick active layer (e.g., about 800 Å to about 1500 Å) can be used to fabricate devices for digital circuitry. These devices will tend to be partially depleted and have floating body effects advantageous for digital circuitry. Other tiles having a relatively thinner thickness (e.g., about 500 Å to about 1000 Å) can be used to fabricate devices for analog circuitry. These devices will tend to be fully depleted and have a smaller degree of floating body effect relative to the tiles having a larger thickness and used for the digital circuitry.

Referring now to FIG. 1a, a cross-section of an exemplary SOI chip 10 having an active layer 12 of non-uniform thickness fabricated in accordance with a first method embodiment is illustrated. As is typical of SOI chips, the active layer 12 is disposed on a buried oxide layer (BOX) 14 which is disposed, in turn, on a silicon substrate 16. The first method embodiment includes locally etching the silicon of the active layer 12 in areas designated for analog circuitry. More specifically, the exemplary SOI chip 10 is divided into three regions, or tile A, tile B and tile C. It is noted that the size, placement and active layer 12 thickness of each tile is left to the designer of the specific SOI chip being fabricated. In addition, one skilled in the art will appreciate that less than or more than the three exemplary tiles can be fabricated on any particular chip. In the illustrated embodiment, the active layer 12 in the area of tile A and C has a relatively thicker thickness for digital circuitry and the active layer 12 in the area of tile B has a relatively thinner thickness for analog circuitry. Example analog circuits which can be fabricated in tile B include RAM cells and phase locked loop (PLL) circuits.

Within the active layer 12, shallow trench isolation (STI) regions 18 define the placement of active regions 20 used for the fabrication of active devices 22d (the "d" herein generally denoting a device for digital circuits) and 22a (the "a"

herein generally denoting a device for analog circuitry). The fabrication of active devices 22a and 22d, such as transistors, using the active layer 12 is well known in the art and will not be described in great detail. It is noted that in the illustrated embodiment, each tile has two schematically represented active devices 22 illustrated therein. One skilled in the art will immediately recognize that the illustrated active devices 22 are merely exemplary and that hundreds, thousands or even millions of interconnected active devices 22 may be formed within the area of a tile and these devices may include other circuit elements such as diodes, resistors, capacitors and the like.

Referring now to FIG. 1b, a cross-section of another exemplary SOI chip 10' having an active layer 12' of non-uniform thickness fabricated according to a second method embodiment is illustrated. The second method embodiment includes locally growing, or depositing, silicon on the active layer 12' in areas designated for digital circuitry. The exemplary chip 10' is also divided into three regions, or tiles A', B', and C'. In the illustrated example, the active layer 12' in the area of tiles A' and C' has a relatively thinner thickness and is intended for use with analog circuitry. The active layer 12' in the area of tile B' has a relatively thicker thickness and is used for the fabrication of digital circuitry.

Referring now to FIG. 1c, a cross-section of another exemplary SOI chip 10" having an active layer 12" of non-uniform thickness fabricated according to a third method embodiment is illustrated. The third method embodiment involves locally implanting oxygen to form an implanted layer of silicon dioxide ($SiO_2$) 30 within the active layer 12". The silicon dioxide layer 30 reduces the thickness of the active layer 12". Noting that the BOX layer 14 is generally formed from silicon dioxide, the implantation of oxygen into the active layer 12" to form the silicon diode layer 30 essentially adds thickness to the BOX layer 14 while reducing the thickness of the active layer 12" in the implanted area. In the illustrated example of the chip 10", the active layer 12" in the area of tiles A" and C" is relatively thicker for use in fabricating digital circuits and the active layer 12" in the area of tile B" is relatively thinner for use in the fabricating analog circuitry.

Figure 2:
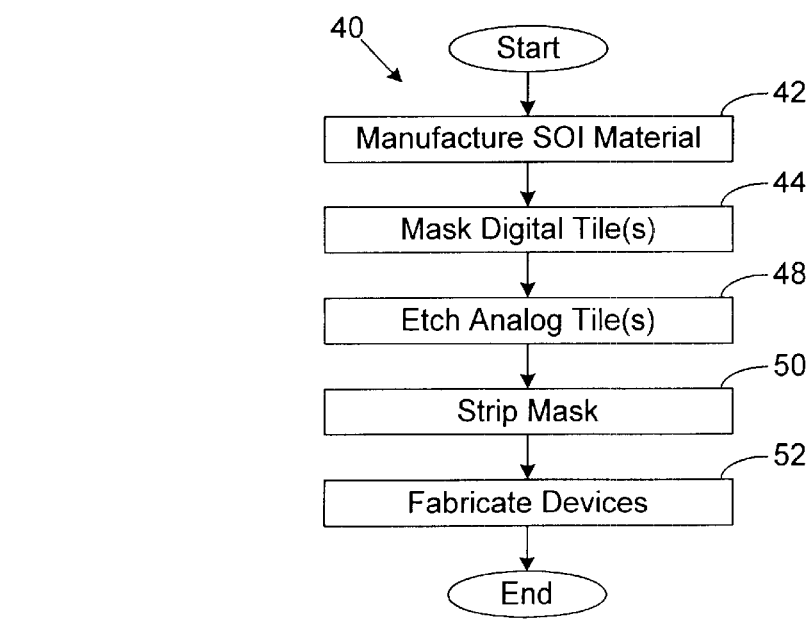
FIG. 2 is a flow chart of a first embodiment of a method for manufacturing an SOI chip having an active layer of non-uniform thickness.
Figure 3A:
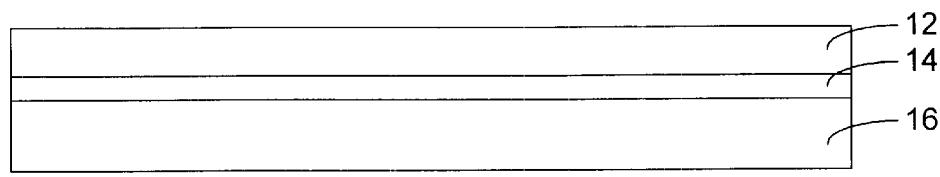
FIGS. 3a–3e are cross-sections of the SOI chip in various stages of fabrication in accordance with the first method embodiment.
Figure 3B:
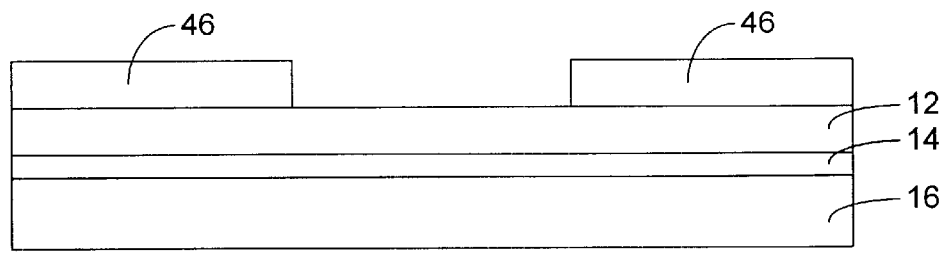

Referring now to FIG. 2, a method 40 according to the first method embodiment for fabricating a SOI chip 10 having an active layer 12 of non-uniform thickness is illustrated in flow chart format. The method 40 starts in step 42 where SOI material is manufactured according to conventional techniques. With additional reference to FIG. 3a, the SOI material has a silicon substrate 16 with a BOX layer 14 disposed thereon. Disposed on the BOX layer 14 is the active layer 12. Next, in step 44, and as illustrated in FIG. 3b, the active layer 12 is masked to define where the active layer 12 should be etched to reduce the thickness of the active layer 12. More specifically, the areas where digital circuitry is to be placed are protected by a layer of mask material 46, such as photo-resist, an oxide or a nitride. In one embodiment, the initial thickness of the active layer 12 is about 800 Å to about 1500 Å thick for the formation of partially depleted active devices.

Figure 3C:
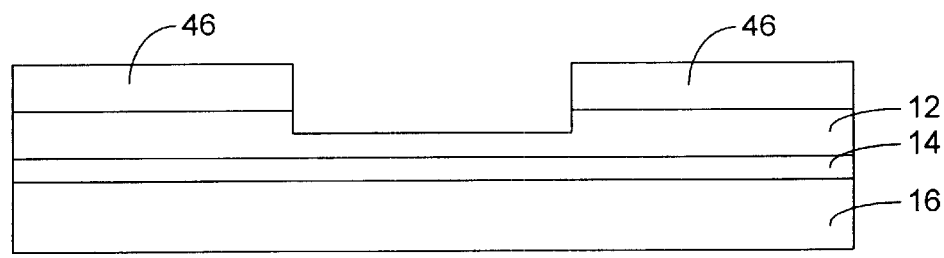
Figure 3D:
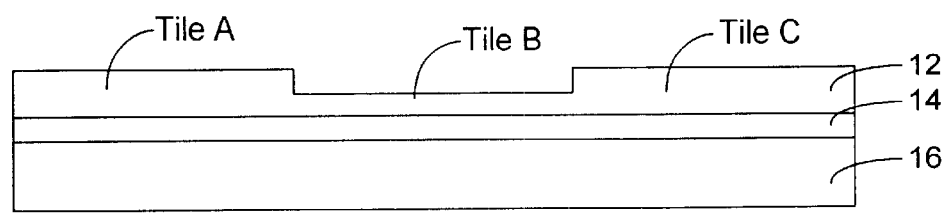
Figure 3E:
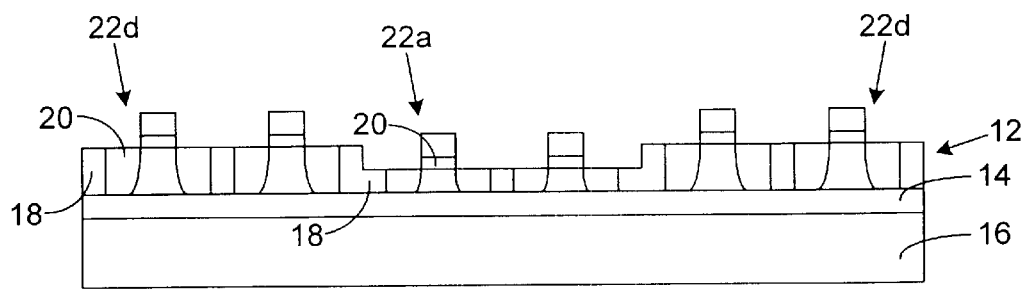

Next in step 48, and as illustrated in FIG. 3c, the active layer 12 is etched to locally reduce the thickness of the active layer 12. In one embodiment, the resulting thickness of the active layer 12 in the etched region is about 500 Å to about 1000 Å for use in fabricating fully depleted active devices for analog circuitry. After the etching step 48, the masked material 46 is stripped in step 50 resulting in the SOI material illustrated in FIG. 3d. As illustrated, the thickness of the active layer 12 is non-uniform. More specifically, the thickness of the active layer 12 varies from tile to tile. Next, in step 52, the various devices to implement the desired circuitry are fabricated using the SOI material illustrated in FIG. 3d. For example, as illustrated in FIG. 3e, the active region can be provided with STI region 18 to define the placement of active regions 20 used to fabricate various active devices 22a and 22d as described in greater detail above.

Figure 4:
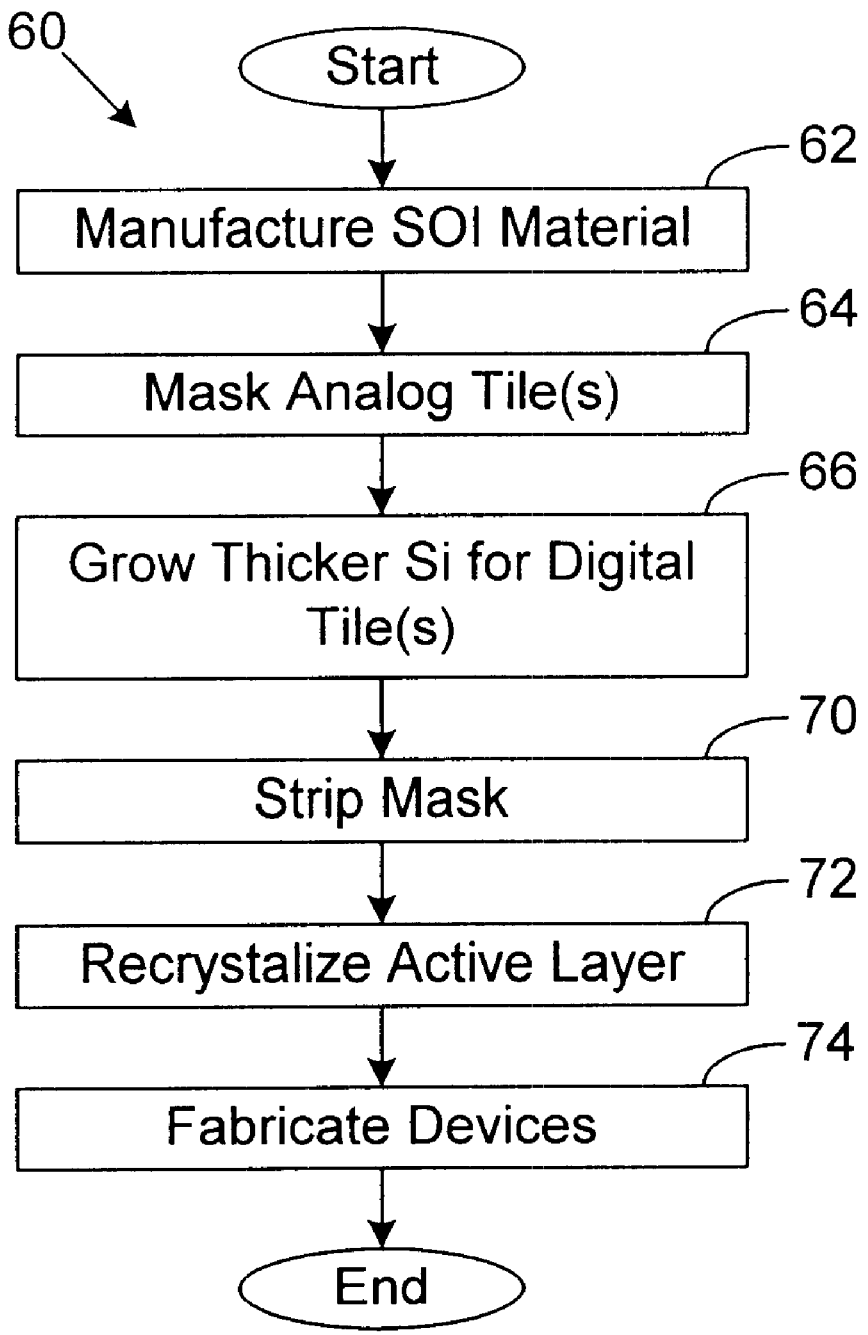
FIG. 4 is a flow chart of a second embodiment of a method for manufacturing an SOI chip having an active layer of non-uniform thickness.
Figure 5A:
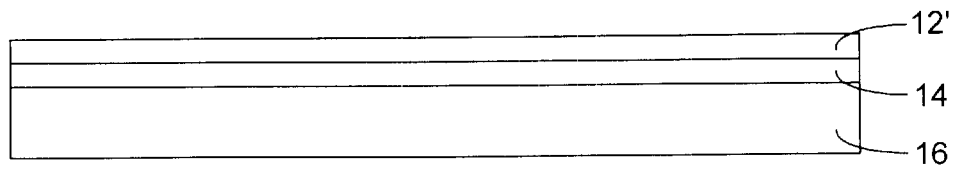
FIGS. 5a–5f are cross-sections of the SOI chip in various stages of fabrication in accordance with the second method embodiment.

Turning now to FIG. 4, a method 60 according to a second method embodiment of the present invention is illustrated in flow chart format. The method 60 starts in step 62 where SOI material is manufactured according to conventional techniques. As illustrated in FIG. 5a, the SOI material includes a silicon substrate 16 having a BOX layer 14 disposed thereon and a silicon active layer 12' disposed on the BOX layer 14. The silicon layer 12' has an initial thickness, in one embodiment, of about 500 Å to about 1000 Å for use in fabrication of device for analog circuitry.

Figure 5B:
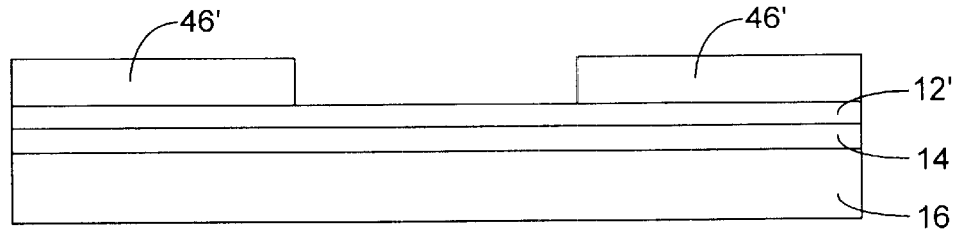
Figure 5C:
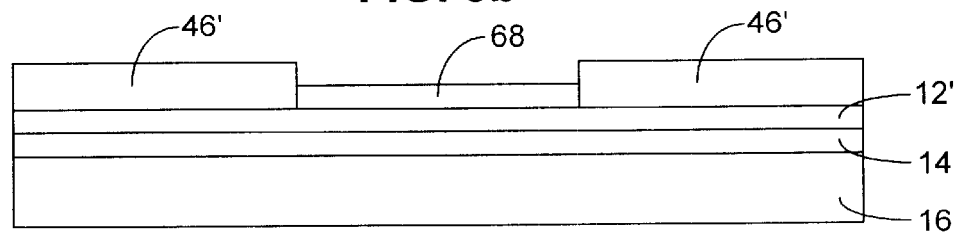

Next, in step 64, and as illustrated in FIG. 5b, regions for analog circuitry of the SOI materials are masked with mask material 46'. The mask material 46' may be selected from a variety of appropriate mask materials, including silicon dioxide.

Figure 5D:
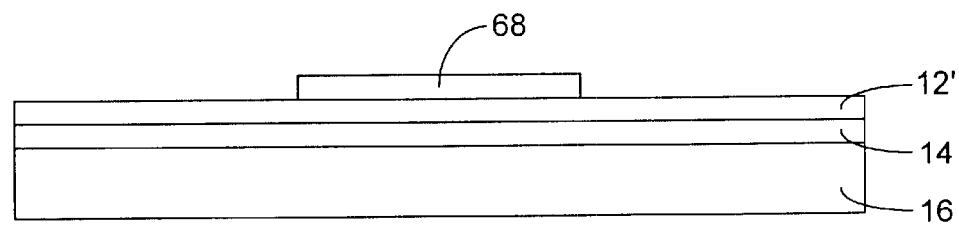

Next, in step 66, a layer of silicon 68 is grown, or deposited, on the unmasked areas of the active layer 12' which are intended to be used for digital circuitry. This locally grown silicon can be formed, for example, using epitaxial growth techniques as is known in the art. Next, in step 70, and as illustrated in FIG. 5d, the mask material 46 is removed.

Figure 5E:
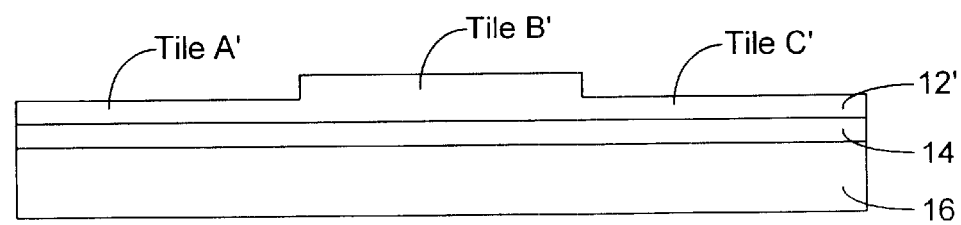
Figure 5F:
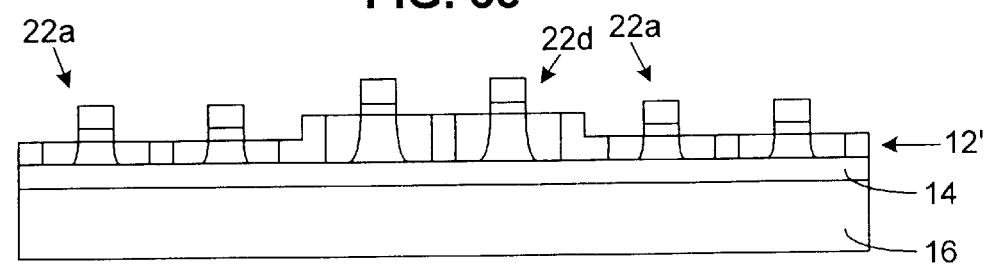

After the masked material 46' has been removed in step 70, the SOI material is processed using a thermal cycle to recrystalize the silicon layer 68 and the silicon of the active layer 12' in step 72 to result in a homogeneous active layer 12' having non-uniform thickness. As illustrated in FIG. 5e, the active layer 12' has a thicker region (tile B') where the silicon layer 30 was grown in step 66 to accommodate devices 22d for digital circuitry and thinner areas (tiles A' and C') to accommodate devices 22a for analog circuitry. These devices are fabricated using known techniques in step 74 and are illustrated in FIG. 5f in the exemplary form discussed above.

Figure 6:
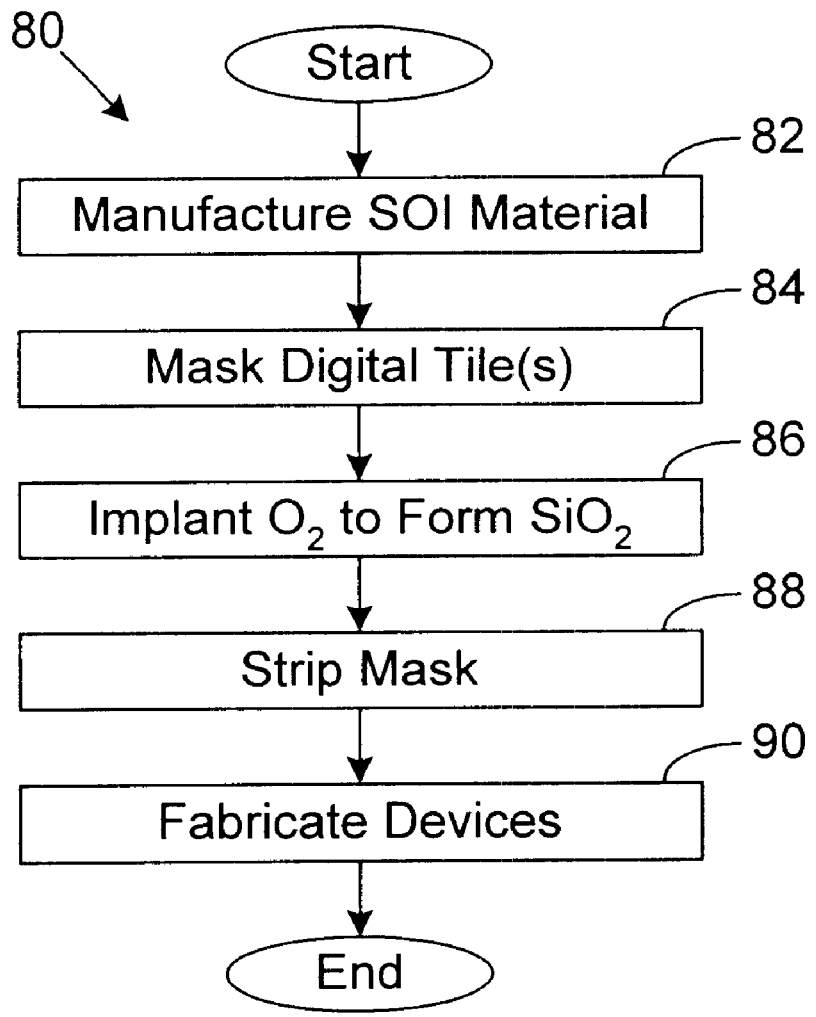
FIG. 6 is a flow chart of a third embodiment of a method for manufacturing an SOI chip having an active layer of non-uniform thickness.
Figure 7A:
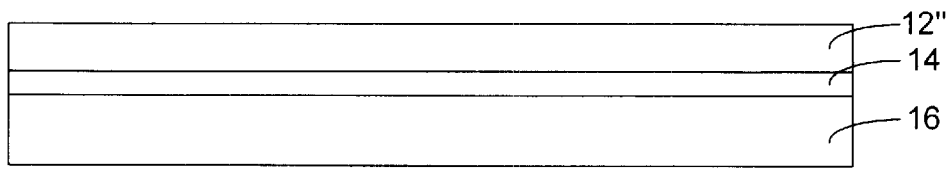
FIGS. 7a–7e are cross-sections of the SOI chip in various stages of fabrication in accordance with the third method embodiment.

Referring now to FIG. 6, a method 80 according to a third method embodiment of manufacturing an SOI chip 10" having an active layer 12" of nonuniform thickness is illustrated in flow chart format. The method 80 starts in step 82 where SOI material is fabricated. With additional reference to FIG. 7a, the SOI material has a silicon substrate 16 with a BOX layer 14 disposed thereon and the active layer 12" disposed on the BOX layer 14. In one embodiment, the active layer 12" has an initial thickness appropriate for the fabrication of devices 22d for digital circuitry such as a thickness of about 800 Å to about 1500 Å.

Figure 7B:
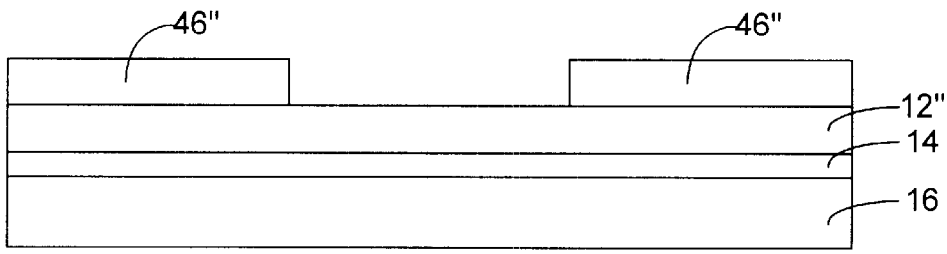
Figure 7C:
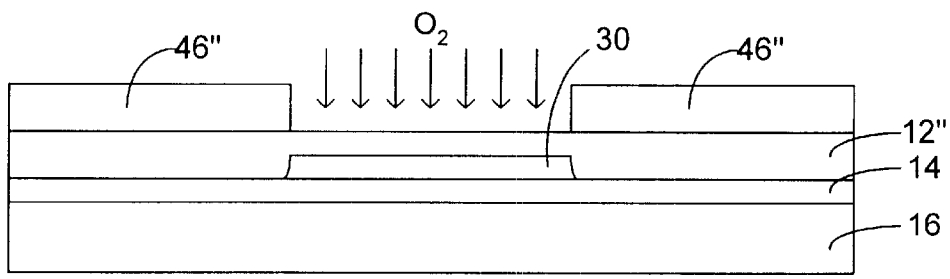

Next, in step 84, and as illustrated in FIG. 7b, an appropriate mask material 46", such as a photo resist, an oxide or a nitride, is deposited on the active layer 12 in areas that will be used to fabricate devices for digital circuitry. Next in step 86, the masked SOI material is implanted with oxygen ($O_2$) in at least the unmasked areas of the SOI material. The oxygen is implanted such that the silicon of the active layer 12" reacts with the oxygen to form a layer of silicon dioxide ($SiO_2$) 30 in the lower portion of the active layer 12" and on top of the BOX layer 14. Sufficient oxygen is implanted to react enough of the active layer 12" to reduce the thickness of the active layer 12" in the unmasked region to a thickness appropriate for fabricating the devices 22a for analog circuitry. In one embodiment, the thickness of the active layer 12" is reduced to about 500 Å to about 1000 Å.

Figure 7D:
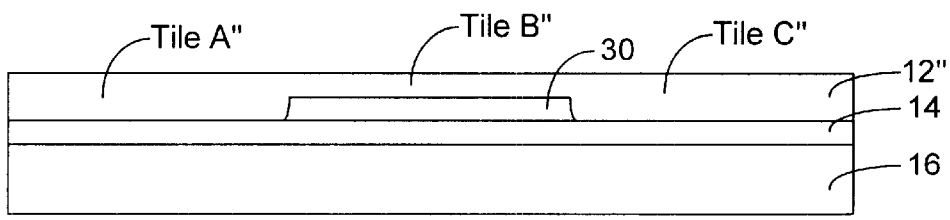
Figure 7E:
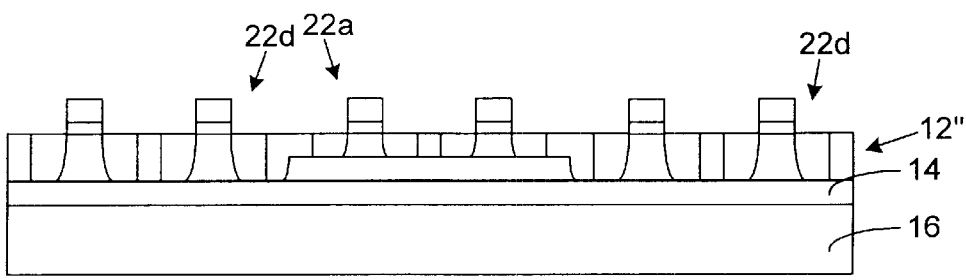

After the layer of silicon dioxide 30 is formed in step 86, the mask material 46" is striped in step 88. The resulting active layer 12" has a non-uniform thickness as exemplified in FIG. 7d. Next, in step 90, and as illustrated in FIG. 7e, devices 22 are fabricated as is desired in the active layer 12". More specifically, in the thicker areas of the active layer 12" (tiles A" and C") devices 22d for digital circuitry are formed and in the thinner area of the active layer 12" (tile B") devices 22a are formed for analog circuitry.

Although particular embodiments of the invention have been described in detail, it is understood that the invention is not limited correspondingly in scope, but includes all changes, modifications and equivalents coming within the spirit and terms of the claims appended hereto. For example, a chip having an active layer with more than two thicknesses can be fabricated. Such a chip, by way of example, could have a first tile with an active layer thickness of about 600 Å, a second tile with an active layer thickness of about 800 Å and a third tile with an active layer thickness of about 1200 Å.

As another example modification, a chip having an active layer that has been varied in thickness by more than one of the techniques discussed herein can be fabricated. Such a chip, by way of example, could have a first tile which has an active layer thickness that has not be changed by etching, silicon deposition or oxygen implantation, a second tile where the active layer has been etched and a third tile where the active layer has had silicon deposited thereon.

In addition, the reason for varying the thickness of the active layer is not limited to forming tiles used for the fabrication of analog circuitry or digital circuitry. Such a chip, by way of example, may have tiles of varying active layer thicknesses where each tile has digital circuitry. The thickness differential between the tiles could be used to control other aspects of the active devices, such as source/drain doping, junction capacitance, floating body effects, switching speed and the like.

What is claimed is:

1. A silicon-on-insulator (SOI) chip, comprising:

a substrate;

a buried oxide (BOX) layer disposed on the substrate; and an active layer disposed on the BOX layer, the active layer divided into a first and a second tile, the first tile having a first thickness and a plurality of partially depleted semiconductor devices formed therefrom, and the second tile having a second thickness and a plurality of fully depleted devices formed therefrom, the second thickness being smaller than the first thickness.

2. The SOI chip according to claim 1, wherein the partially depleted devices form digital circuitry and the fully depleted devices form analog circuitry.

3. The SOI chip according to claim 1, wherein the first thickness is about 800 Å to about 1500 Å.

4. The SOI chip according to claim 1, wherein the second thickness is about 500 Å to about 1000 Å.

5. The SOI chip according to claim 1, wherein the active layer has an initially uniform thickness and the thickness of the active layer in the area of the second tile is reduced by etching.

6. The SOI chip according to claim 1, wherein the active layer has an initially uniform thickness and the thickness of the active layer in the area of the first tile is increased by silicon deposition.

7. The SOI chip according to claim 1, wherein the active layer has an initially uniform thickness and the thickness of the active layer in the area of the second tile is reduced by implanting oxygen to form a layer of silicon dioxide in a lower portion of the active layer adjacent the BOX layer.

8. The SOI chip according to claim 1, wherein each partially depleted device has an active region that includes a source, a drain and a body disposed between the source and the drain.

9. The SOI chip according to claim 8, wherein the active layer in the area of each body of the partially depleted devices has a uniform thickness.

10. The SOI chip according to claim 8, wherein each fully depleted device has an active region that includes a source, a drain and a body disposed between the source and the drain of the fully depleted device.

11. The SOI chip according to claim 10, wherein the active layer in the area of each body of the fully depleted devices has a uniform thickness.

12. The SOI chip according to claim 10, wherein the active layer in the area of each body of the partially depleted devices has a uniform thickness proportional to the first thickness and the active layer in the area of each body of the fully depleted devices has a uniform thickness proportional to the second thickness.

* * * * *